US010535543B2

(12) United States Patent
Watanabe et al.

(10) Patent No.: US 10,535,543 B2
(45) Date of Patent: Jan. 14, 2020

(54) TEACHING JIG, SUBSTRATE PROCESSING APPARATUS, AND TEACHING METHOD

(71) Applicant: HITACHI KOKUSAI ELECTRIC INC., Tokyo (JP)

(72) Inventors: Akihito Watanabe, Toyama (JP); Ryo Yamaguchi, Toyama (JP); Yasuhiro Joho, Toyama (JP); Katsumi Takashima, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 247 days.

(21) Appl. No.: 15/658,584

(22) Filed: Jul. 25, 2017

(65) Prior Publication Data

US 2018/0033666 A1   Feb. 1, 2018

(30) Foreign Application Priority Data

Aug. 1, 2016  (JP) .................. 2016-151203

(51) Int. Cl.
| | | |
|---|---|---|
| *G05B 15/00* | (2006.01) | |
| *G05B 19/00* | (2006.01) | |
| *H01L 21/677* | (2006.01) | |
| *G05B 19/42* | (2006.01) | |
| *H01L 21/67* | (2006.01) | |

(52) U.S. Cl.
CPC ........ *H01L 21/67796* (2013.01); *G05B 19/42* (2013.01); *H01L 21/67098* (2013.01)

(58) Field of Classification Search
CPC .............. G05B 19/42; H01L 21/67098; H01L 21/67259; H01L 21/67781; H01L 21/67796
See application file for complete search history.

(56) References Cited

U.S. PATENT DOCUMENTS

| | | | |
|---|---|---|---|
| 2004/0144933 A1 | 7/2004 | Emoto et al. | |
| 2004/0197174 A1* | 10/2004 | Van Den Berg | ........................... H01L 21/67781 414/404 |
| 2004/0202362 A1 | 10/2004 | Ishikawa et al. | |
| 2005/0061441 A1* | 3/2005 | Hashinoki | ................. G03F 7/38 156/345.31 |

(Continued)

FOREIGN PATENT DOCUMENTS

| | | |
|---|---|---|
| CN | 100444348 C | 12/2008 |
| JP | 10-321701 A | 12/1998 |

(Continued)

OTHER PUBLICATIONS

Korean Office Action dated Oct. 1, 2018 for the Korean Patent Application No. 20170094006.

(Continued)

*Primary Examiner* — Harry Y Oh
(74) *Attorney, Agent, or Firm* — Volpe and Koenig, P.C.

(57) ABSTRACT

A teaching jig includes: a first plate that determines a substrate loading position in a forward/backward direction with respect to a substrate holder which holds a substrate; a second plate that determines the substrate loading position in a leftward/rightward direction with respect to the substrate holder, the second plate being installed to be perpendicular to the first plate and movable in the forward/backward direction; and a positioning target pin installed in the first plate.

11 Claims, 15 Drawing Sheets

(56) References Cited

U.S. PATENT DOCUMENTS

| | | | |
|---|---|---|---|
| 2007/0117228 A1 | 5/2007 | Tooyama et al. | |
| 2007/0273892 A1 | 11/2007 | Asari et al. | |
| 2008/0199283 A1* | 8/2008 | Mitsuyoshi | H01L 21/67201 414/222.01 |
| 2008/0295769 A1* | 12/2008 | Kawagoe | H01L 21/67259 118/696 |
| 2010/0083898 A1* | 4/2010 | Kogura | C23C 16/405 118/692 |
| 2010/0310342 A1* | 12/2010 | Yang | H01L 21/67109 414/222.01 |
| 2013/0330154 A1* | 12/2013 | Sowden | H01L 21/67253 414/222.02 |
| 2014/0041805 A1* | 2/2014 | Kuga | H01J 37/02 156/345.33 |
| 2014/0045281 A1* | 2/2014 | Aiura | H01L 22/30 438/16 |
| 2016/0023356 A1* | 1/2016 | Hara | H01L 21/67259 355/72 |
| 2016/0090241 A1* | 3/2016 | Zhang | H01L 21/67706 198/782 |

FOREIGN PATENT DOCUMENTS

| | | |
|---|---|---|
| JP | 2898587 B2 | 3/1999 |
| JP | 3247495 B2 | 11/2001 |
| JP | 2004-165543 A | 6/2004 |
| JP | 3869098 B2 | 10/2006 |
| JP | 2007-142269 A | 6/2007 |
| JP | 4439993 B2 | 1/2010 |
| TW | 200414399 A | 8/2004 |
| TW | 200539270 A | 12/2005 |

OTHER PUBLICATIONS

Taiwanese Office Action dated Apr. 15, 2019 for the Taiwanese Patent Application No. 106123983.

* cited by examiner

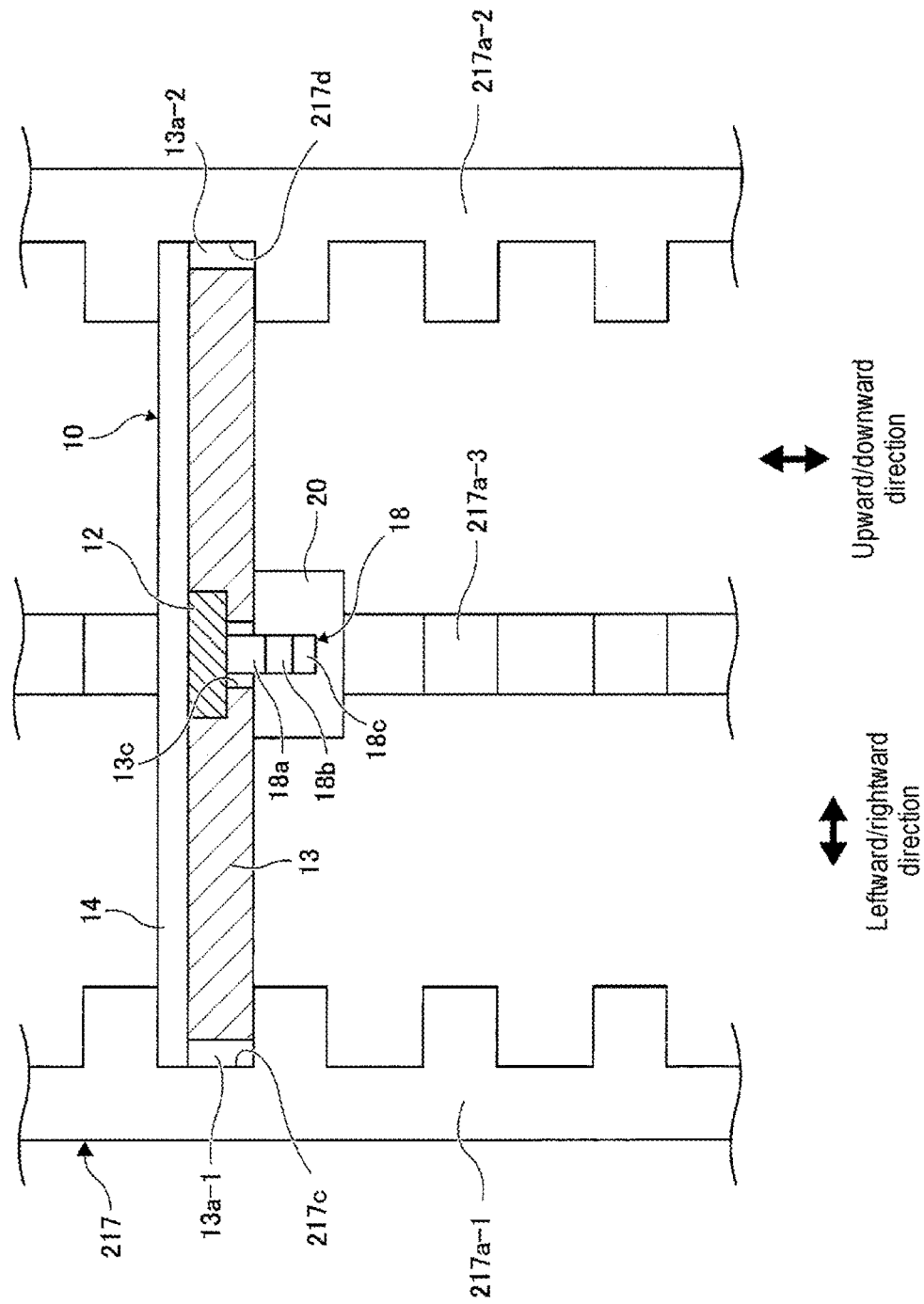

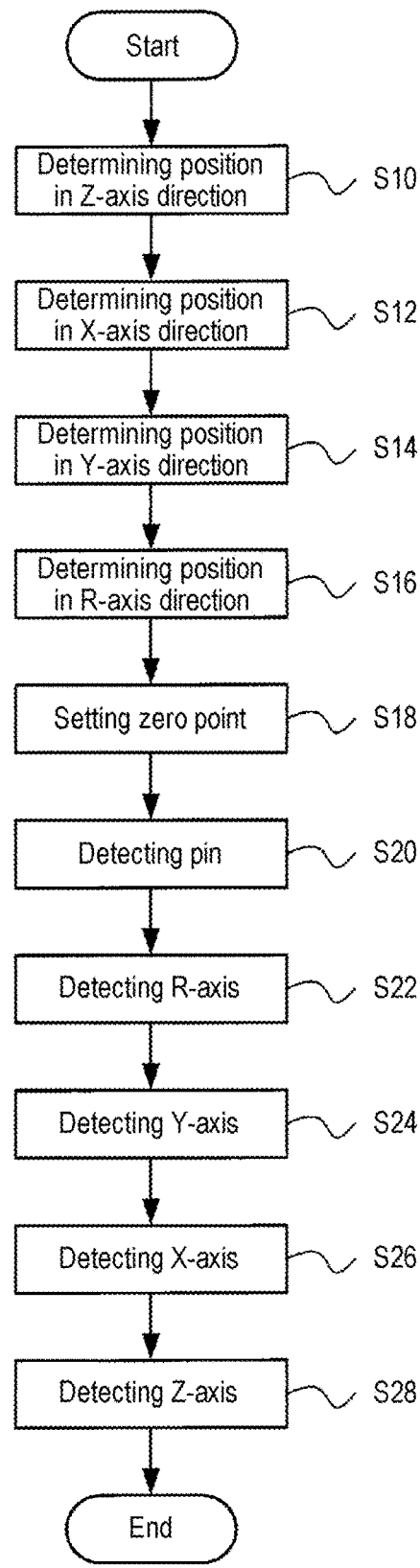

FIG. 12A
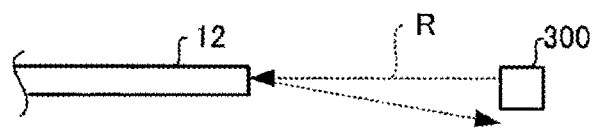
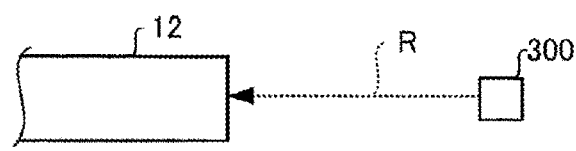
FIG. 12B
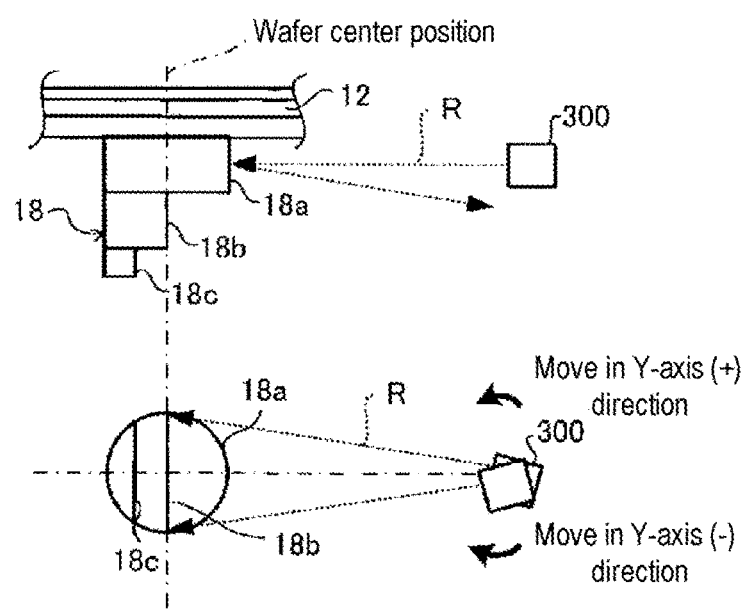

TEACHING JIG, SUBSTRATE PROCESSING APPARATUS, AND TEACHING METHOD

CROSS-REFERENCE TO RELATED APPLICATION

This application is based upon and claims the benefit of priority from Japanese Patent Application No. 2016-151203, filed on Aug. 1, 2016, the entire contents of which are incorporated herein by reference.

TECHNICAL FIELD

The present disclosure relates to a teaching jig, a substrate processing apparatus, and a teaching method.

BACKGROUND

In a process of manufacturing a semiconductor device, a substrate held by a substrate holder is received in a reaction furnace, and subjected to various kinds of substrate processing such as a deposition or an annealing. In a substrate processing apparatus for performing the process above, a substrate to be processed is transferred between the substrate holder and a substrate container by a substrate transfer device that is installed in the substrate processing apparatus in advance.

Conventionally, an operation (teaching) for determining a substrate transfer position in the substrate holder or the substrate container by the substrate transfer device has been conducted relying on an operator's senses. Specifically, in the conventional teaching method, when a transfer position in the substrate holder, for example, is to be determined, the operator manipulates the substrate transfer device while visually checking the clearance between the substrate and the substrate holder such that the substrate is transferred to a predetermined substrate loading position with respect to the substrate holder, thereby determining the transfer position. Therefore, the operation fluctuates depending on the operator's degree of skill, causing a problem that the teaching operation cannot be performed with a constant degree of precision for the respective devices and thus appropriate substrate processing cannot be performed.

SUMMARY

Some embodiments of the present disclosure provide a technique that enables a high-quality substrate processing.

According to one embodiment of the present disclosure, there is provided a teaching jig including: a first plate that determines a substrate loading position in a forward/backward direction with respect to a substrate holder which holds a substrate; a second plate that determines the substrate loading position in a leftward/rightward direction with respect to the substrate holder, the second plate being installed to be perpendicular to the first plate and movable in the forward/backward direction; and a target pin installed in the first plate.

BRIEF DESCRIPTION OF DRAWINGS

FIG. 8 is a longitudinal sectional view, taken along line B-B in FIG. 7, of the teaching jig suitably used for an embodiment of the present disclosure.

FIG. 11 is a flowchart illustrating a detection operation by a sensor part using the teaching jig suitably used for an embodiment of the present disclosure.

FIG. 12A schematically illustrates an R-axis detection operation using the teaching jig suitably used for an embodiment of the present disclosure; FIG. 12B schematically illustrates a Y-axis detection operation using the teaching jig suitably used for an embodiment of the present disclosure.

DETAILED DESCRIPTION (1) Configuration of Substrate Processing Apparatus

Hereinafter, an embodiment of the present disclosure will now be described with reference to the accompanying drawings.

Figure 1:
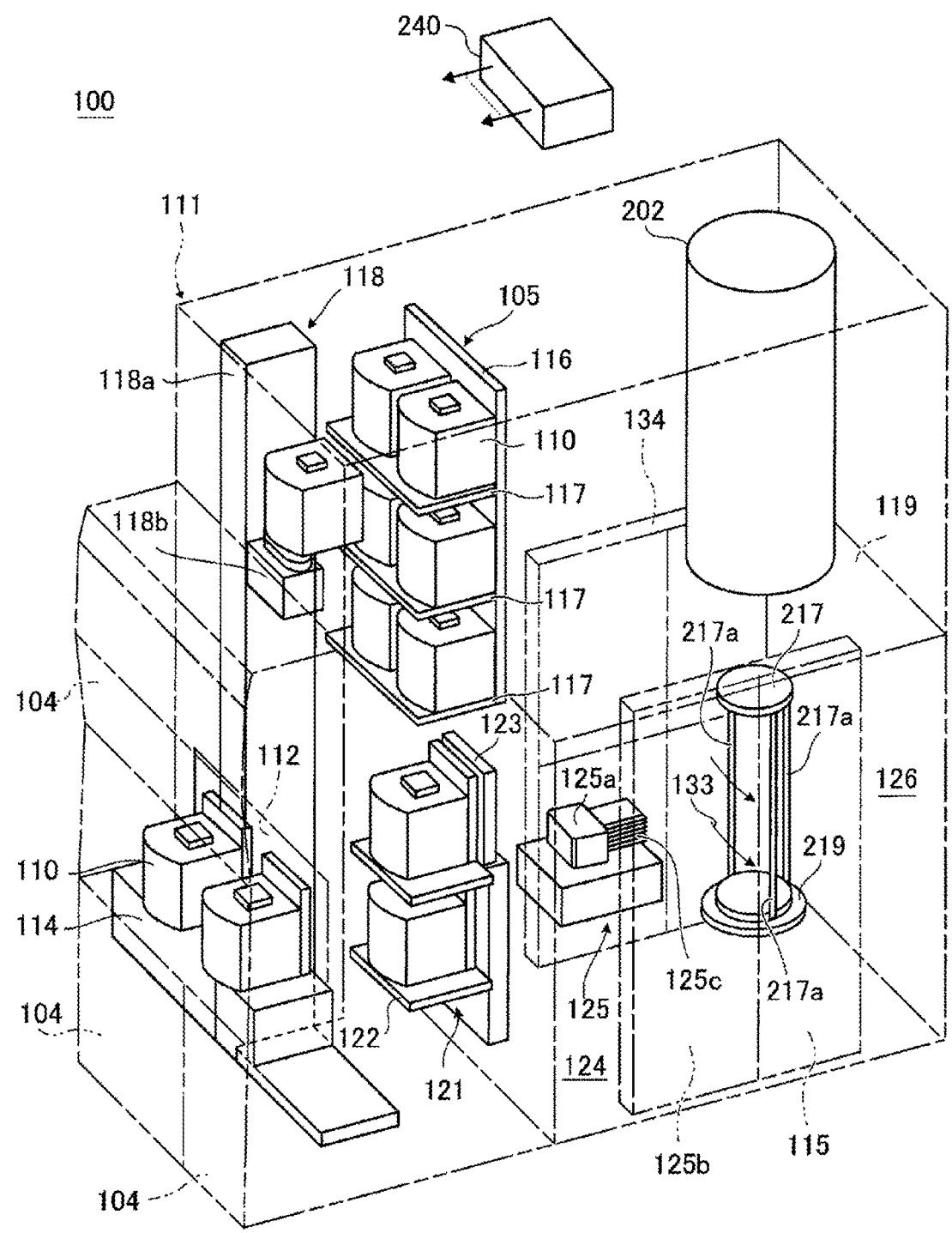
FIG. 1 illustrates a schematic configuration of a substrate processing apparatus suitably used for an embodiment of the present disclosure.
Figure 2:
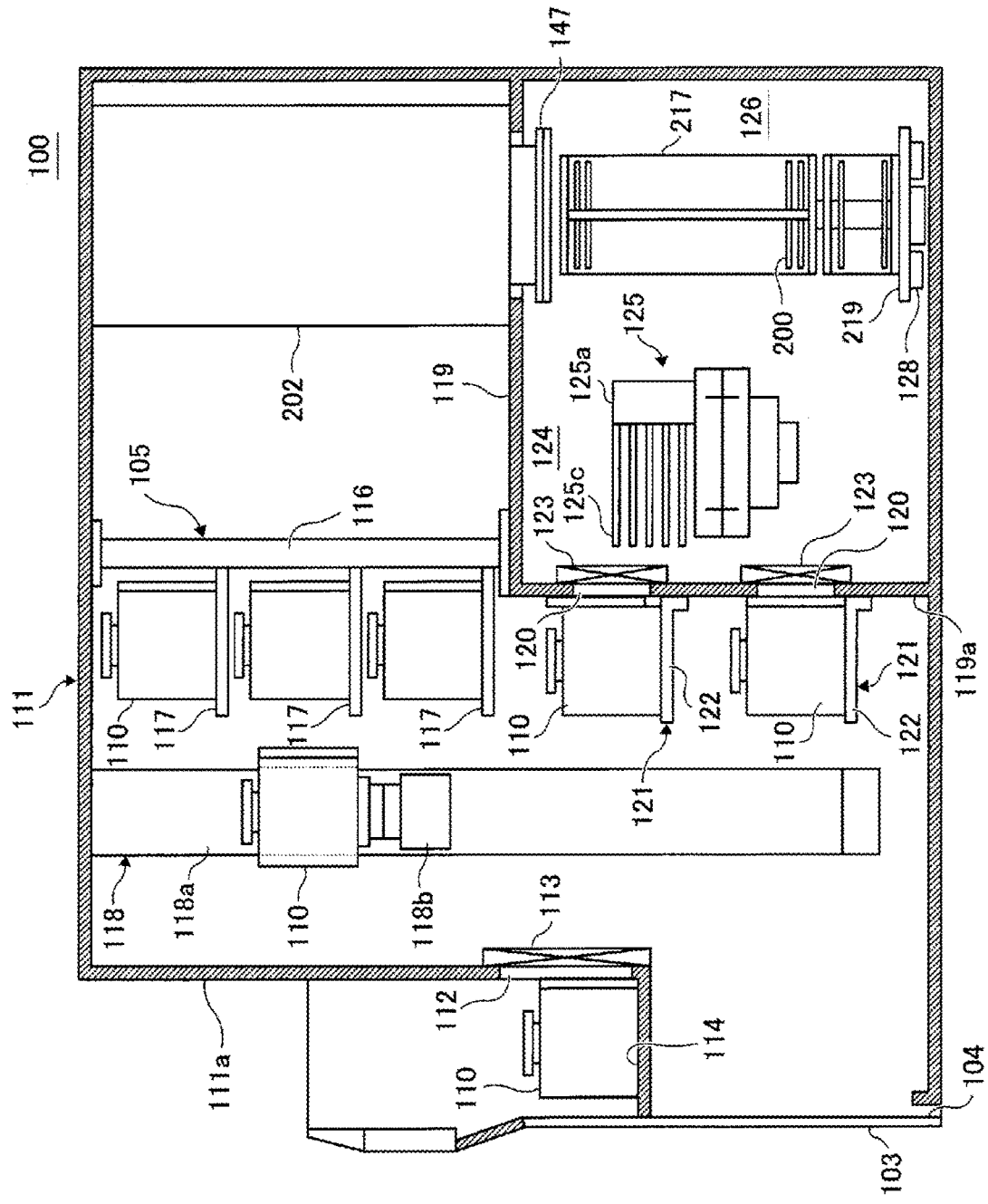
FIG. 2 illustrates a side section of the substrate processing apparatus suitably used for an embodiment of the present disclosure.

As illustrated in FIGS. 1 and 2, a FOUP (also referred to as a POD; hereinafter, referred to as a pod) is used as a wafer carrier, which is a substrate container that receives a predetermined number of wafers 200 as substrates made of silicon or the like. The substrate processing apparatus 100 has a housing 111 as a main body of the substrate processing apparatus 100. In FIG. 1, the side at which a maintenance door 104 to be described later is positioned is defined as the front side of the apparatus, and the side at which a standby part 126 is positioned is defined as the rear side. The same definition will be applied in connection with other drawings when the forward/backward direction is described with regard to the apparatus.

At the front side of a front surface of a front wall 111a of the housing 111, a front maintenance opening 103 as an opening for maintenance is formed, and the front maintenance door 104 for opening/closing the front maintenance opening 103 is installed. A pod loading/unloading opening 112 is formed in the front wall 111a of the housing 111 so as to communicate the inside of the housing 111 with the outside of the housing 111. The pod loading/unloading opening 112 is opened/closed by a front shutter 113. A load port 114 as a loading/unloading part is installed at the front side of the front surface of the pod loading/unloading opening 112. A pod 110 is loaded and positioned on the load port 114. The pod 110 is loaded to and unloaded from the load port 114 by an in-process transport device (not illustrated) such as an OHT (Overhead Hoist transport).

A pod shelf (housing shelf) 105 is installed in the upper portion of the substantially center portion of the interior of the housing 111 in the forward/backward direction. The pod shelf 105 includes a support portion 116 installed vertically and loading portions 117 installed in multiple stages at respective positions of, for example, the upper stage, the middle stage, and the lower stage, with respect to the support portion 116. The loading portions 117 are supported so as to be vertically-movable independently. That is to say, the pod shelf 105 is configured to hold a plurality of pods 110 in a state where the plurality of pods 110 are respectively loaded on the multiple stages of the loading portions 117. The pod shelf 105 receives a plurality of pods 110 in the vertically multiple stages in a state where, for example, two pods 110 facing the same direction are arranged in a line in each of the stages.

A pod transfer device (container transfer mechanism) 118 is installed between the load port 114 and the pod shelf 105 inside the housing 111. The pod transfer device 118 includes a pod elevator 118a as a shaft portion that can move upward and downward in the vertical direction while holding the pod 110 and a pod transfer part 118b as a transfer part that loads the pod 110 and transfers the same in the horizontal direction. The pod transfer device 118 transfers the pod 110 among the load port 114, the pod shelf 105, and pod openers 121 by means of continuous operations of the pod elevator 118a and the pod transfer part 118b.

A sub housing 119 is installed in the lower portion of the substantially center portion of the interior of the housing 111 in the forward/backward direction. The sub housing 119 extends to the rear end of the housing 111. Wafer loading/unloading openings 120 for loading and unloading the wafer 200 with respect to the inside of the sub housing 119 are formed in a front wall 119a of the sub housing 119. The wafer loading/unloading openings 120 are arranged, for example, in vertically two stages, and a pair of pod openers 121 is installed at the wafer loading/unloading openings 120 in the upper and lower stages. The pod opener 121 includes a mounting stage 122 on which the pod 110 is mounted and a cap attaching/detaching mechanism 123 for attaching and detaching a cap as a sealing member of the pod 110. The pod opener 121 opens and closes a wafer port of the pod 110 by attaching and detaching the cap of the pod 110 mounted on the mounting stage 122 using the cap attaching/detaching mechanism 123.

The sub housing 119 constitutes a transfer chamber 124 that is fluidically isolated from the installation space of the pod transfer device 118 and the pod shelf 105. A wafer transfer mechanism (substrate transfer mechanism) 125 is installed in the front side area of the transfer chamber 124. The wafer transfer mechanism 125 includes a wafer transfer device (substrate transfer device) 125a capable of horizontally rotating and linearly moving the wafers 200 and a wafer transfer device elevator 125b for moving the wafer transfer device 125a upward and downward. As schematically illustrated in FIG. 1, the wafer transfer device elevator 125b is installed on the right surface of the transfer chamber 124 of the sub housing 119. By means of continuous operations of the wafer transfer device elevator 125b and the wafer transfer device 125a, the wafers 200 are charged and discharged with respect to a boat 217 as a substrate holder using tweezers 125c, which are substrate holding bodies (substrate transfer bodies) of the wafer transfer device 125a, as mounting portions of the wafers 200.

The rear side area of the transfer chamber 124 configures the standby part 126 where the boat 217 is received and stood-by. A processing furnace 202 as a processing chamber is installed above the standby part 126. The lower end of the processing furnace 202 is opened and closed by a furnace-opening shutter 147. When necessary, for example, if it is required to decrease an oxygen concentration according to a wafer processing condition, a preliminary chamber (load lock chamber, not illustrated) may be installed to surround the standby part 126 positioned right below the processing furnace 202, thereby decreasing the oxygen concentration in advance or cooling the wafers processed.

Figure 7:
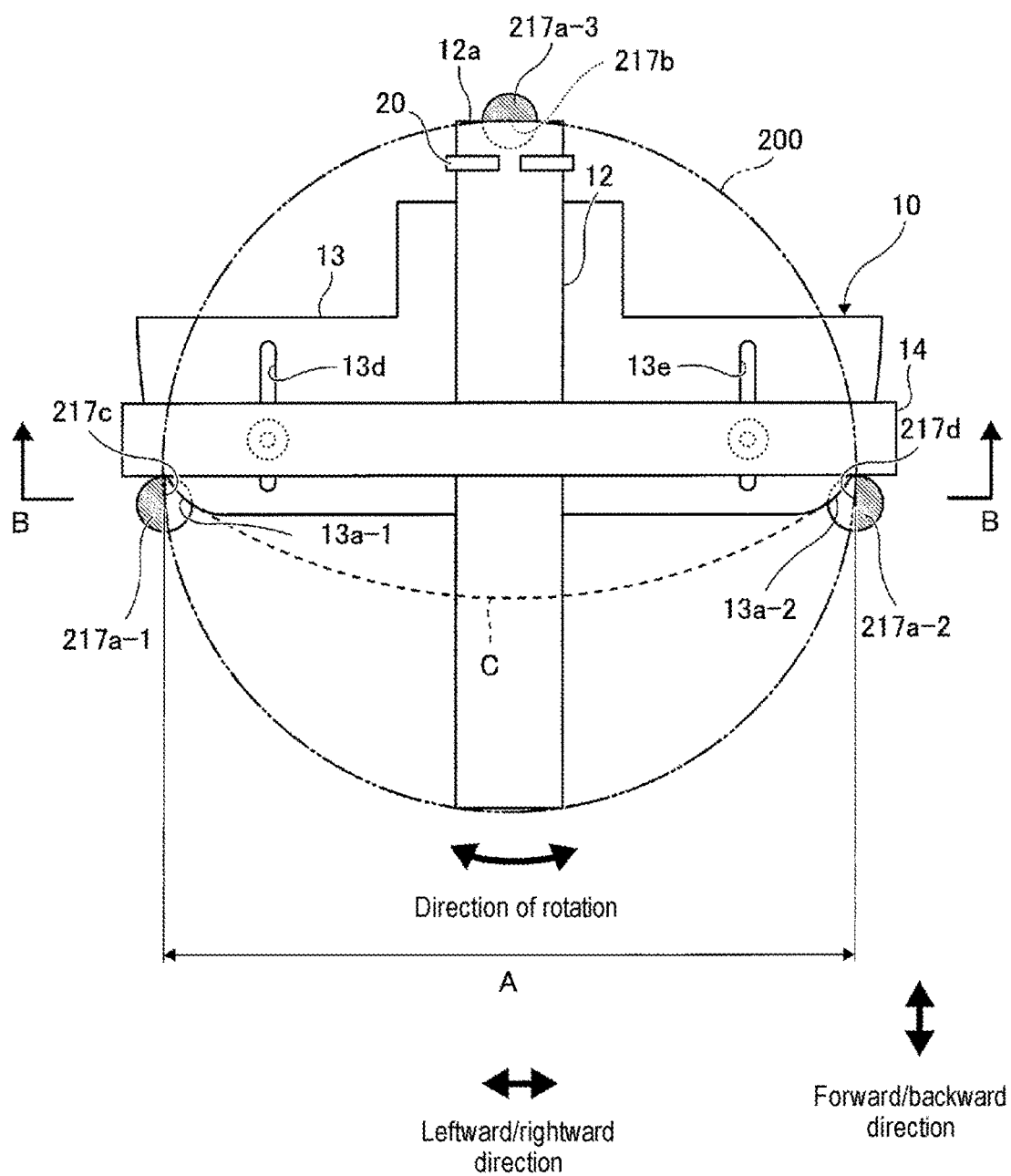
FIG. 7 schematically illustrates a state in which the teaching jig suitably used for an embodiment of the present disclosure is loaded on a boat.

As schematically illustrated in FIG. 1, a boat elevator 115 for moving the boat 217 upward and downward is installed on the right surface of the standby part 126. An arm 128 as a connecting member is connected to an elevating table of the boat elevator 115, and a seal cap 219 as a lid member is horizontally installed on the arm 128. The seal cap 219 vertically supports the boat 217 and is capable of closing the lower end of the processing furnace 202. The boat 217 has a plurality of boat columns 217a as substrate holding columns, and horizontally holds a plurality of (for example, 25 to 500) wafers 200 which is aligned concentrically in vertically multiple stages. As illustrated in FIG. 7, the boat 217 in the present embodiment has three boat columns including two boat columns 217a-1 and 271a-2 arranged to face each other and a boat column 217a-3 arranged in a position rotated 90° from the boat columns 217a-1 and 217a-2 along the circumferential direction of top and bottom plates of the boat 217.

As schematically illustrated in FIG. 1, a clean unit 134 including a supply fan and a dustproof filter is installed on the left surface of the transfer chamber 124, which is opposite the wafer transfer device elevator 125b and the boat elevator 115. The clean unit 134 supplies a clean air 133, which is a purified atmosphere or an inert gas. The clean air 133 blown out of the clean unit 134 flows to the wafer transfer device 125a and the boat 217 in the standby part 126, and is then suctioned by a duct (not illustrated) and discharged to the outside of the housing 111. Alternatively, the clean air 133 circulates to reach a supply side of the clean unit 134, which is a suction side (left surface side) of the clean unit 134, and is again blown into the transfer chamber 124 by the clean unit 134.

Figure 3:
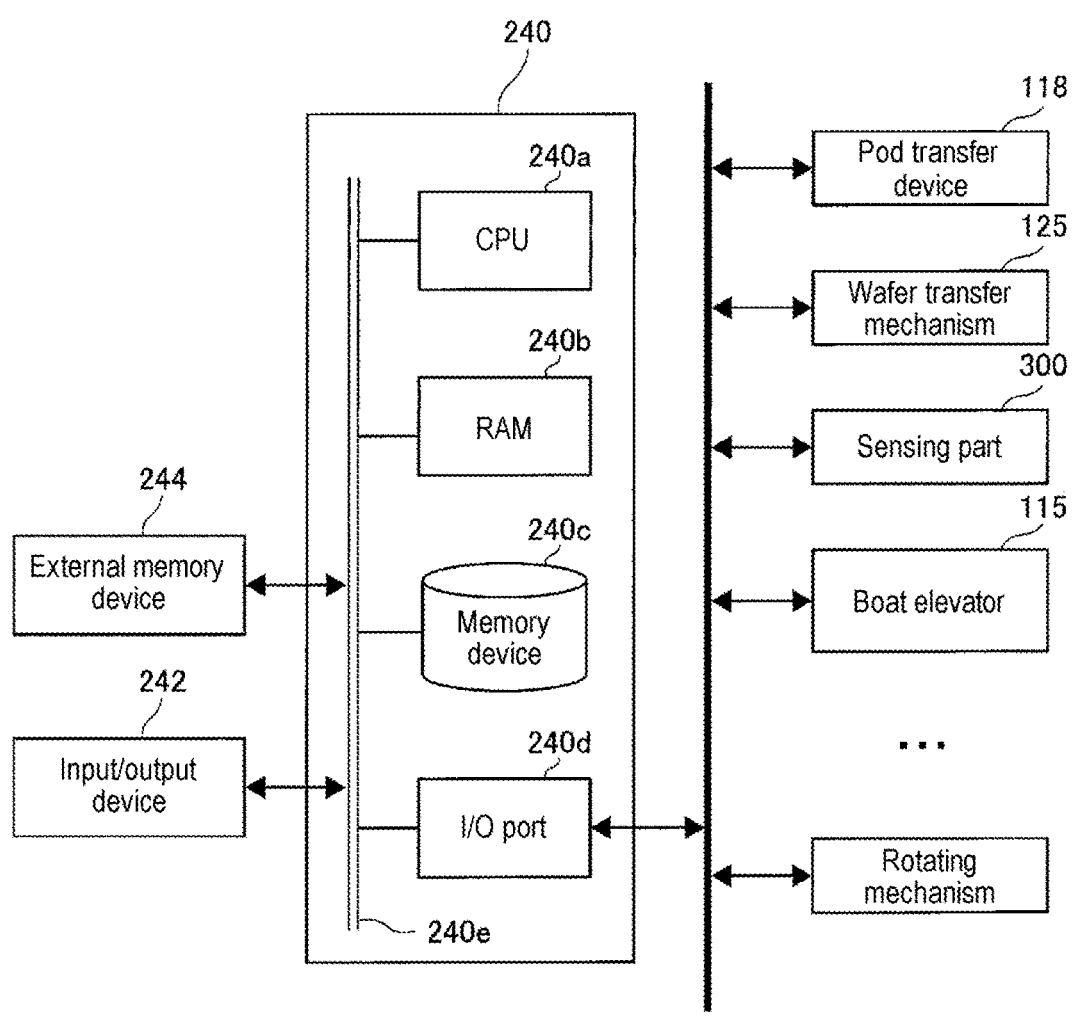
FIG. 3 illustrates a schematic configuration of a controller of the substrate processing apparatus suitably used for an embodiment of the present disclosure, which is a block diagram of a control system of the controller.

As illustrated in FIG. 3, a controller 240 as a control part (control means) is configured as a computer including a CPU (Central Processing Unit) 240a, a RAM (Random Access Memory) 240b, a memory device 240c, and an I/O port 240d. The RAM 240b, the memory device 240c, and the I/O port 240d can exchange data with the CPU 240a via an internal bus 240e. An input/output device 242 configured by, for example, a touch panel, is connected to the controller 240.

The memory device 240c is composed of, for example, a flash memory, an HDD (Hard Disk Drive), or the like. In The memory device 240c, a control program for controlling the operation of the substrate processing apparatus, a process recipe in which procedures and conditions of a substrate treatment to be described later are described, and the like are readably stored. The process recipe functions as a program for causing the controller 240 to execute each sequence in the substrate processing process, which will be described later, to obtain a predetermined result. Hereinafter, the process recipe and the control program will be generally and simply referred to as a "program." When the term "program" is used herein, it may indicate a case of including only the process recipe, a case of including only the control program, or a case of including both the recipe and the control program. The RAM 240b is configured as a memory area (work area) in which a program or data read by the CPU 240a is temporarily stored.

The I/O port 240d is connected to the above-mentioned pod transfer device 118, the wafer transfer mechanism 125, a sensing part 300 (described later), the boat elevator 115, and the like.

The CPU 240a is configured to read and execute the control program from the memory device 240c and to read the process recipe from the memory device 240c in response to an input of an operation command from the input/output device 242, or the like. The CPU 240a controls, according to the contents of the process recipe thus read, the operations of transferring pods 110 by the pod transfer device 118, charging and discharging wafers 200 by the wafer transfer mechanism 125, sensing of wafers 200 and a teaching jig by the sensing part 300 (described later), lifting the boat 217 by the boat elevator 115, and the like.

The controller 240 may be configured by installing the aforementioned program, which is stored in an external memory device (for example, a magnetic disk such as a hard disk or the like, an optical disk such as a CD or the like, a magneto-optical disk such as an MO or the like, or a semiconductor memory such as a USB memory or the like) 244, in a computer. The memory device 240c or the external memory device 244 is configured as a non-transitory computer-readable recording medium. Hereinafter, the memory device 240c and the external memory device 244 will be generally and simply referred to as a "recording medium." When the term "recording medium" is used herein, it may indicate a case of including only the memory device 240c, a case of including only the external memory device 244, or a case of including both the memory device 240c and the external memory device 244. The program may be supplied via a communication means such as the Internet or a dedicated line without going through the external memory device 244.

The configuration of the wafer transfer device 125a will now be described in detail with reference to FIG. 4.

Figure 4:
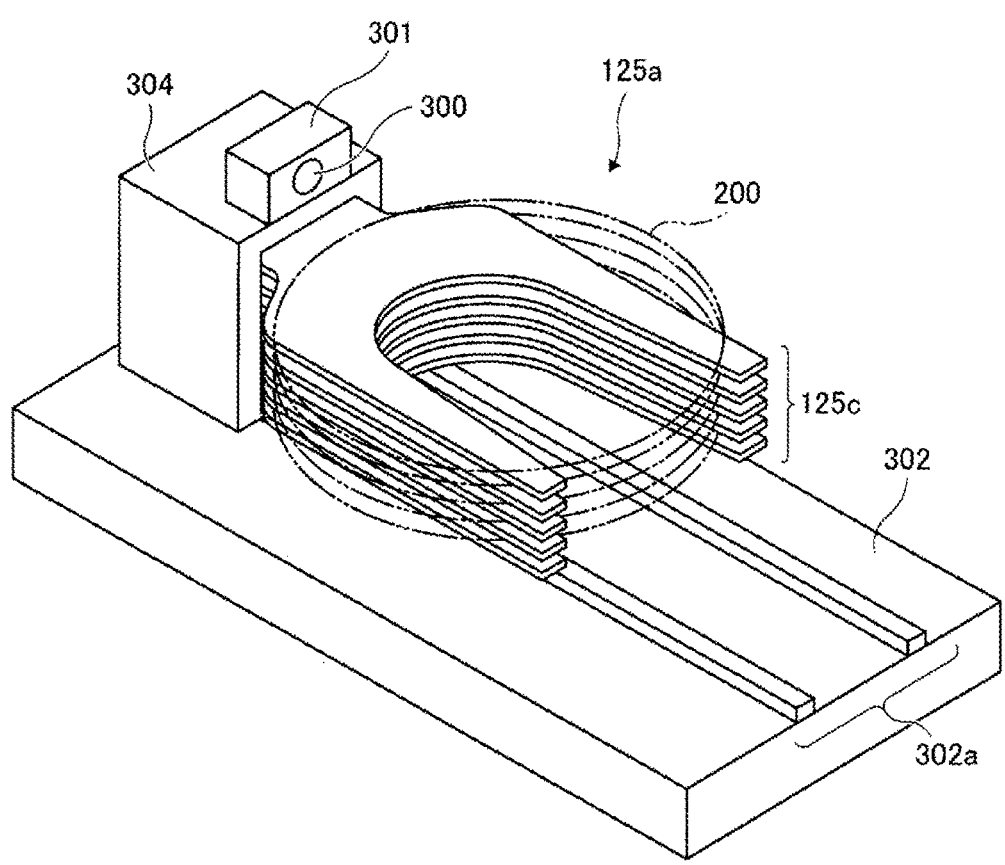
FIG. 4 illustrates a schematic configuration of a substrate transfer device suitably used for an embodiment of the present disclosure.

As illustrated in FIG. 4, the wafer transfer device 125a mainly includes the tweezers 125c that transfers the wafers 200 mounted thereon, the sensing part 300 that detects the position in which the wafers 200 are mounted, and a guide part 302 that guides the tweezers 125c and the sensing part 300.

The guide part 302 as a pedestal of the wafer transfer device 125a is capable rotating horizontally, and has, for example, two guide rails 302a for guiding the tweezers 125c in one-axis direction on the upper surface thereof. In the present embodiment, the two guide rails 302a are arranged substantially in parallel with each other.

The tweezers 125c are mounted on a fixing part 304 that fixes the direction of movement of the tweezers 125c, and moves as the fixing part 304 slides along the guide rails 302a. In addition, the tweezers 125c rotates as the guide part 302 rotates horizontally. The tweezers 125c have, for example, a U-shape, and a plurality of (five, in the present embodiment) tweezers 125c is horizontally installed and equally spaced in vertical.

That is to say, the fixing part 304 of the wafer transfer device 125a slides in the forward/backward direction along the guide rails 302a, the tweezers 125c rotates horizontally (in the leftward/rightward direction to be described later) by the rotation of the guide part 302, and the wafer transfer device 125a is moved in the upward/downward direction by the wafer transfer device elevator 125b.

The sensing part 300 is used as a length-measuring unit such as a laser displacement gauge, for example. The sensing part 300 is covered by a protection cover 301 and installed in the vicinity of the tweezers 125c on the upper surface of the fixing part 304. By installing the sensing part 300 on the fixing part 304, detection can be made at a constant distance and height from the transferred wafers 200. In addition, the sensing part 300 can detect a teaching jig 10 to be described later, and thus it is possible to obtain the substrate loading position (position information) in which the wafers 200 are loaded on the basis of coordinate positions in the directions indicated by arrows in FIGS. 7 and 8, that is to say, the forward/backward direction (the X-axis direction), the leftward/rightward direction (the Y-axis direction), the upward/downward direction (the Z-axis direction), and the rotational direction (the R-axis direction). In the present disclosure, in connection with the X-axis direction illustrated in FIG. 7, the direction toward the lower side of the drawing is defined as the forward (front side) direction, and the direction toward the upper side thereof is defined as the backward (rear side) direction. Also, in connection with the Y-axis direction illustrated in FIG. 7, the direction toward the left side of the drawing is defined as the leftward direction, and the direction toward the right side thereof is defined as the rightward direction. Hereinafter, the forward/backward direction and the leftward/rightward direction with respect to the boat 217 refer to the forward/backward direction (the direction in which the wafers are loaded into and unloaded from the boat 217, also referred to as a wafer transfer direction) and the leftward/rightward direction illustrated in FIG. 7, respectively. Furthermore, in connection with the Z-axis direction illustrated in FIG. 8, the direction toward the upper side of the drawing is defined as the upward direction, and the direction toward the lower side thereof is defined as the downward direction. Hereinafter, the upward/downward direction with respect to the boat 217 refers to the upward/downward direction illustrated in FIG. 8.

The sensing part 300 is a sensor that optically senses the position of the teaching jig 10, and the sensed sensing information is stored in the memory device 240c or in the external memory device 244 as position information. In addition, an operation command from the input/output device 242 is input to the controller 240, and a status or encoder value obtained by the controller 240 is input to and stored in the memory device 240c or the external memory device 244. The encoder value corresponds to the number of pulses generated by the driving motors of the wafer transfer device 125a and the wafer transfer device elevator 125b. Thus, it possible to perform an operation control while detecting the distance of movement of the wafer transfer device 125a (that is to say, the distance of movement of the tweezers 125c).

As will be described later, the position information and the encoder value stored in the memory device 240c or the external memory device 244 correspond to data (parameters) for controlling the operations of the wafer transfer device 125a and the wafer transfer device elevator 125b. During the transfer of the wafers 200 in a substrate processing process (actual process) performed after the teaching operation, the controller 240 operates the wafer transfer mechanism 125 (the wafer transfer device 125a and the wafer transfer device elevator 125b) on the basis of the position information and the encoder value stored in the memory device 240c or the external memory device 244.

In order to obtain the aforementioned position information, the teaching jig 10 is used.

Figure 5:
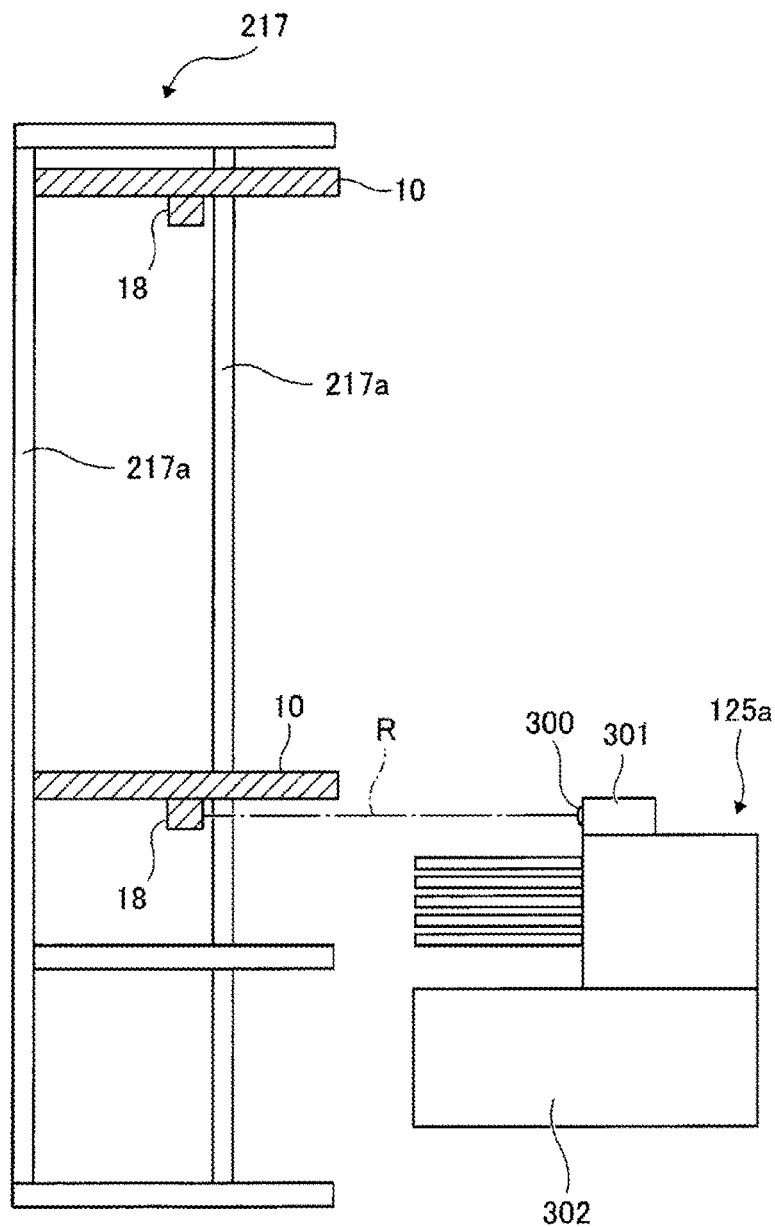
FIG. 5 schematically illustrates a loading position of a teaching jig suitably used for an embodiment of the present disclosure.

As illustrated in FIG. 5, two teaching jigs 10 may be installed to acquire the position information. In this case, one teaching jig 10 is installed in a boat groove of the uppermost slot (the highest slot for loading the wafers 200) of the boat columns 217a, and the other teaching jig 10 is installed in the boat groove of the $n^{th}$ slot from the bottom (the second slot from the bottom when twenty-five wafers are processed, for example). Alternatively, one teaching jig 10 may be installed in one of the boat grooves to acquire one position information, and then installed in the other one of the boat grooves to acquire the other position information. The position information is acquired after the teaching jig 10 is installed in a predetermined position, which is the installation position when the teaching is performed.

Figure 6A:
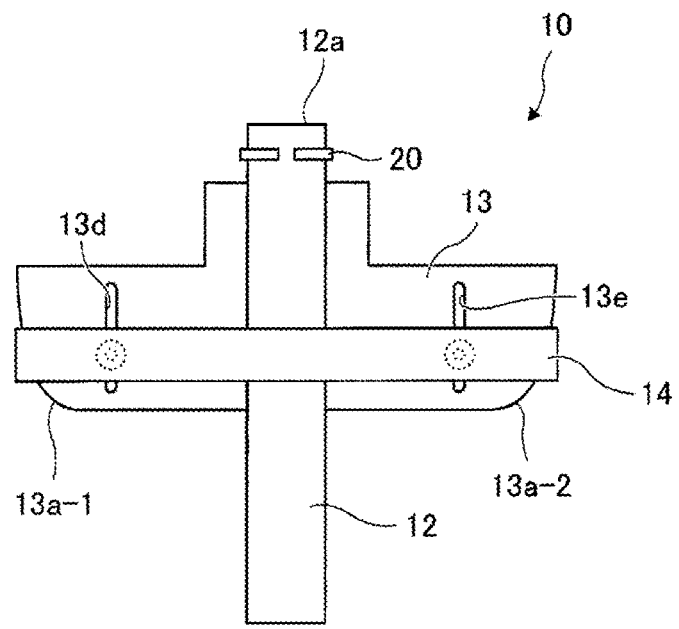
FIG. 6A is a plan view illustrating the exterior of the teaching jig suitably used for an embodiment of the present disclosure.

As illustrated in FIG. 6A, the teaching jig 10 includes a first plate 12, a second plate 13 which is installed to be perpendicular to the first plate 12 and configured to be movable in the forward/backward direction, and a third plate 14 which is installed to be movable in parallel with the second plate 13.

A portion of the teaching jig 10 in contact with the boat 217 is made of a member such as a predetermined resin that hardly generates particles. Thus, it is possible to prevent the teaching jig 10 from contaminating the boat 217 or from serving as a particle generating source during a teaching operation.

Figure 6B:
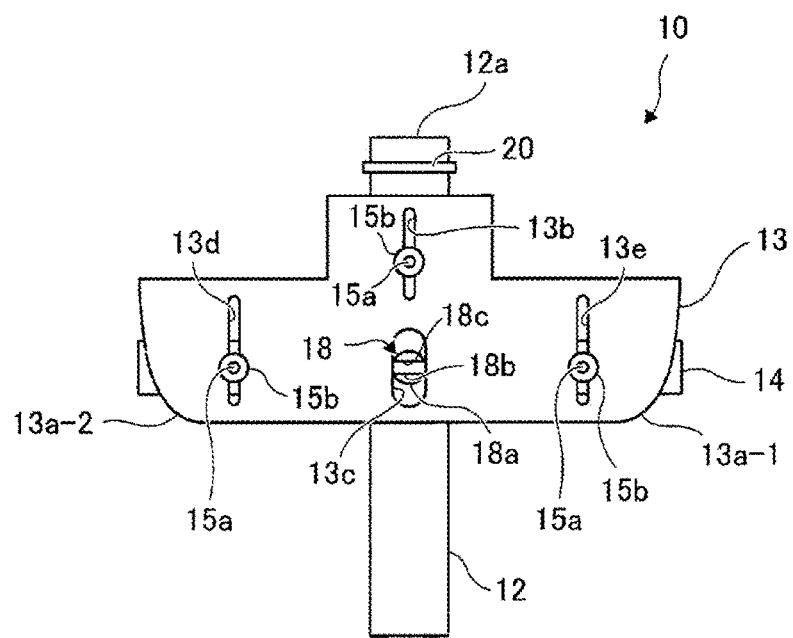
FIG. 6B is a bottom view illustrating the exterior of the teaching jig illustrated in FIG. 6A.

As illustrated in FIG. 7, the first plate 12 has a long-plate shape, and a leading end portion 12a thereof is installed in the boat groove 217b of the rear boat column 217a-3 among the boat columns 217a serving as a holding member for holding the wafers 200 in the backward and leftward/rightward holding positions. In addition, as illustrated in FIG. 6B, a target pin 18 for determining a position where the wafer 200 is loaded is installed at the substantially center portion of the rear side of the first plate 12.

Figure 9A:
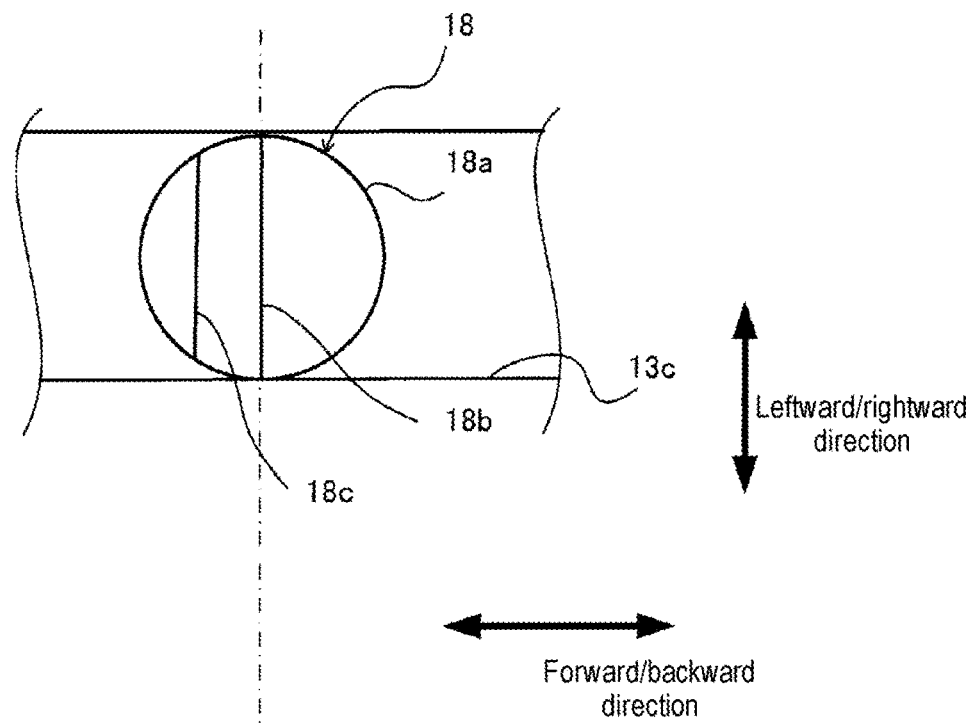
FIG. 9A is an enlarged bottom view illustrating the vicinity of a target pin of the teaching jig suitably used for an embodiment of the present disclosure.
Figure 9B:
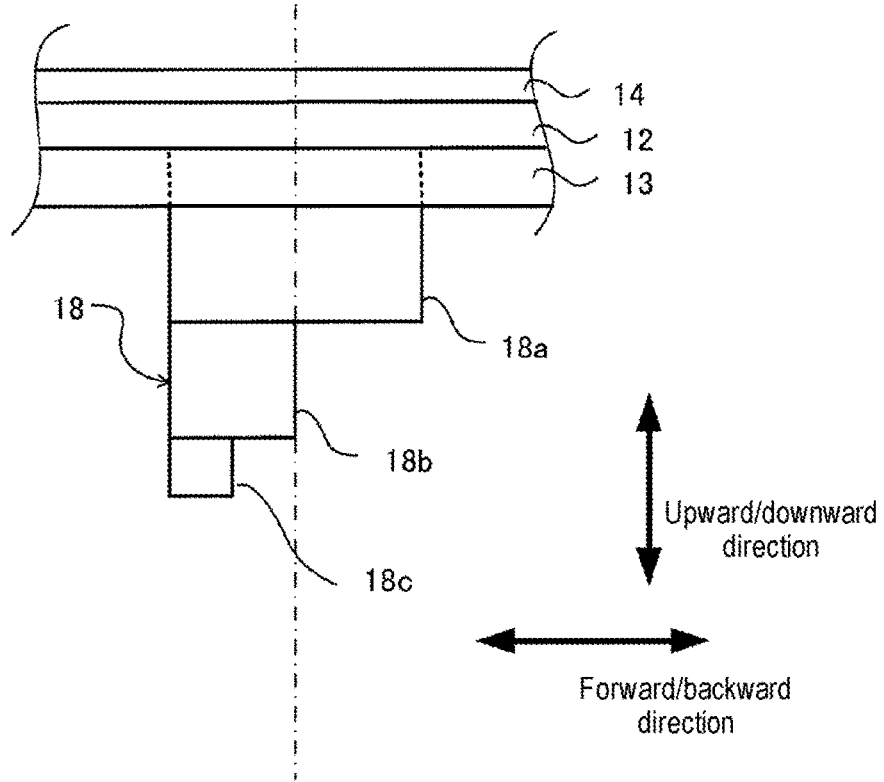
FIG. 9B is an enlarged side view illustrating the vicinity of the target pin of the teaching jig illustrated in FIG. 9A.

As illustrated in FIGS. 6B, 8, 9A, and 9B, the target pin 18 has a cylindrical exterior, and has stepped portions 18a, 18b, and 18c formed on its front surface in the forward/backward direction (the right side in FIGS. 9A and 9B). The front surface of the stepped portion 18a has a curved shape, and the front surfaces of the stepped portions 18b and 18c have planar shapes. In addition, the front surface of the stepped portion 18b is formed at the rear side from the front surface of the stepped portion 18a in the forward/backward direction, and the front surface of the stepped portion 18c is formed at the further rear side than the front surface of the stepped portion 18b in the forward/backward direction.

An antireflection member 20 is installed at the rear side from the target pin 18 of the first plate 12. The antireflection member 20 prevents a laser light (R) emitted from the sensing part 300 from reaching the boat columns 217a and from being reflected or undergoing irregular reflection, thereby avoiding erroneous sensing.

The second plate 13 has a plate shape in which a part of the second plate 13 overlapping with the first plate 12 protrudes toward the leading end portion 12a. At the front side of the both end portions of the second plate 13, circular arc portions 13a-1 and 13a-2 are formed. The circular arc portions 13a-1 and 13a-2 are formed to have the same radius of curvature as that of the circumference of the virtual circle C as illustrated in FIG. 7. The virtual circle C has a diameter larger than the distance A between boat grooves 217c and 217d, and has a center at a location different from that of the center of the loading position of wafer 200. In addition, the second plate 13 has a plurality of (four, in the present embodiment) slits 13b, 13c, 13d, and 13e formed substantially in parallel with the first plate 12.

The slit 13b is formed in a portion overlapping with the first plate 12. An engaging pin 15a installed in the first plate 12 engages with the second plate 13 by means of an engaging pin fixing member 15b via the slit 13b. Thus, the second plate 13 can slide in the X-axis direction with respect to the first plate 12 along the slit 13b. The slit 13c is formed in a position in which the target pin 18 of the first plate 12 is arranged. Thus, when the second plate 13 slides with respect to the first plate 12, the target pin 18 can perform the teaching process to be described later without interfering with the sliding of the second plate 13. The slits 13d and 13e are formed to have the same length and substantially in parallel with each other. Engaging pins 15a installed in the third plate 14 to be described later engage with the second plate 13 by means of engaging pin fixing members 15b via the slits 13d and 13e, respectively. Thus, the third plate 14 can slide in the X-axis direction with respect to the second plate 13 along the slits 13d and 13e.

As illustrated in FIG. 7, the circular arc portions 13a-1 and 13a-2 make contact with the left and right boat columns 217a-1 and 217a-2, respectively, and the second plate 13 is mounted in the boat grooves 217c and 217d. By forming the circular arc portions 13a-1 and 13a-2 are formed along the virtual circle C having a diameter larger than the distance A between the boat grooves 217c and 217d, a position that vertically bisects the distance between the boat grooves 217c and 217d is determined. Thus, the substantially center portion in the Y-axis direction is determined.

The third plate 14 has a long-plate shape, and movably engages with respect to the second plate 13 along the above-mentioned two slits 13d and 13e. That is to say, the third plate 14 is configured to be movable substantially perpendicularly to the first plate 12 and substantially in parallel with the second plate 13. The third plate 14 may have a longitudinal length larger than the longitudinal length of the second plate 13.

(2) Teaching Process

Next, as one of many semiconductor device manufacturing processes, particularly, as a process of preparing a substrate processing process to be described later, a process of performing teaching of the wafer transfer device 125a using the above-mentioned teaching jig 10 will be described with reference to FIGS. 10A to 12D.

Figure 10A:
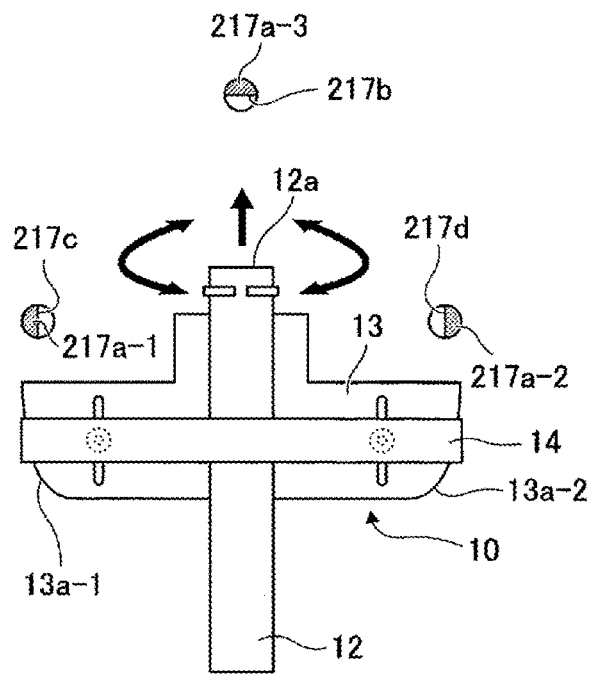
FIG. 10A schematically illustrates an operation of installing the teaching jig suitably used for an embodiment of the present disclosure on the boat, which illustrates a positioning in the X-axis direction.
Figure 10B:
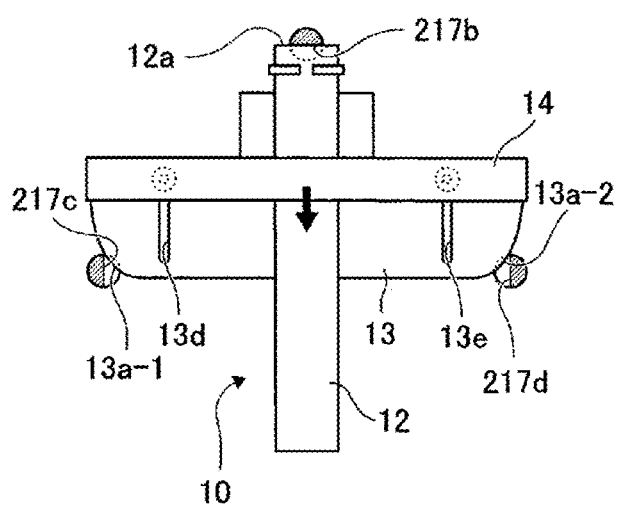
FIG. 10B schematically illustrates an operation of installing the teaching jig suitably used for an embodiment of the present disclosure on the boat, which illustrates a positioning in the Y-axis direction from the position illustrated in FIG. 9A.
Figure 10C:
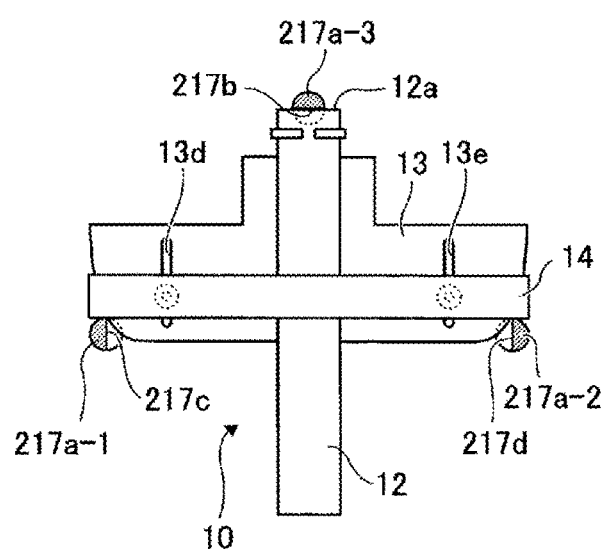
FIG. 10C schematically illustrates an operation of installing the teaching jig suitably used for an embodiment of the present disclosure on the boat, which illustrates a positioning in the R-axis direction from the position illustrated in FIG. 9B.

As illustrated in FIG. 10A, in step S10 first, the boat grooves 217b, 217c, and 217d of the boat 217 on which the teaching jig 10 is loaded are determined, and positioning in the Z-axis direction is performed. After determining the boat grooves 217b, 217c, and 217d on which the teaching jig 10 is loaded, in step S12, the teaching jig 10 is pivoted and inserted among the three boat columns 217a-1, 217a-2, and 217a-3, and the leading end portion 12a of the first plate 12 is pressed against the boat column 217a-3 inside the boat groove 217b of the rear boat column 217a-3, thereby performing positioning in the X-axis direction. As illustrated in FIG. 10B, in step S14, the left and right circular arc portions 13a-1 and 13a-2 of the second plate 13 are pressed against the left and right boat columns 217a-1 and 217a-2 inside the boat grooves 217c and 217d of the two front boat columns 217a-1 and 217a-2, thereby performing positioning in the Y-axis direction (left/right equivalent positioning). As illustrated in FIG. 10C, in step S16, the third plate 14 is made to slide and is pressed against the two front boat columns 217a-1 and 217a-2, thereby performing positioning in the rotational direction (R-axis direction).

The target pin 18 is fixed on the first plate 12 in a position spaced from the leading end portion 12a by a predetermined distance, particularly, at a location corresponding to the distance from the boat column 217a-3 to the wafer center when wafers 200 are loaded in the boat 217. Thus, it is possible to determine the center position in the X-axis direction by pressing the leading end portion 12a of the first plate 12 against the boat column 217a-3 of the boat groove 217b. The circular arc portions 13a-1 and 13a-2 of the second plate 13 are then pressed against the boat columns 217a-1 and 217a-2 of the boat grooves 217c and 217d, respectively, thereby determining the center position in the Y-axis direction. Thereafter, the third plate 14 is brought into contact with the boat columns 217a-1 and 217a-2 of the boat grooves 217c and 217d, thereby determining the R-axis direction. By installing the teaching jig 10 in the aforementioned order, it is possible to install the target pin 18 in the center position of the boat 217 (center position of the wafers 200), thereby enabling positioning in a predetermined position in the X-axis direction, the Y-axis direction, the Z-axis direction, and the R-axis direction inside the boat grooves 217b, 217c and 217d. That is to say, the clearance with respect to the boat columns 217a can be determined to be a predetermined distance without relying on the operator's eyesight. Thus, it is possible to provide installation reproductivity and use the teaching jig 10 regardless of dimension fluctuations resulting from the machine difference, for example, the distance between the boat columns 217a.

In the substrate processing apparatus 100, a teaching operation is performed using the teaching jig 10 having the above configuration, as will be described below, and then a transferring operation of the wafers 200 is performed. In the teaching operation, first, the operator installs two teaching jigs 10 in the boat groove of the uppermost slot of the boat columns 217a and in the boat groove of the $n^{th}$ slot (the second slot from the bottom when twenty-five wafers are processed, for example), respectively. Alternatively, the operator may install one teaching jig 10 in one of the boat grooves of the two slots. The wafer transfer device 125a is fixed in a home position, which serves as a reference position of the operation. In this state, the position of the two teaching jigs 10, which have been inserted and charged in the boat 217, is detected by the sensing part 300, and the wafer position information obtained from this detection is stored in the memory device 240c or in the external memory device 244.

Next, a teaching operation of the wafer transfer device 125a using the teaching jig 10 will be described with reference to FIGS. 11 to 12D.

As illustrated in FIG. 11, in step S18, a zero point is set as the home position of the R-axis, the X-axis, the Y-axis, and the Z-axis of the wafer transfer device 125a (sensing part 300).

Subsequently, in step S20, the wafer transfer device 125a is moved in the X-axis, Y-axis, and Z-axis directions and a laser light R is emitted from the sensing part 300, thereby detecting the position of the target pin 18 of the teaching jig 10.

Subsequently, in step S22, as illustrated in FIG. 12A, a laser light R is emitted from the sensing part 300 toward the front surface of the front end portion of the first plate 12 of the teaching jig 10, thereby adjusting the R-axis position in which a side surface of the wafer 200 is arranged, on the basis of whether a reflected light exists or not. In connection with this detecting operation, after the approximate position is assumed (provisionally detected) on the basis of the sizes of the radius of the wafer 200 and the depth of the boat 217, a rough detection and a precise detection are repeated to perform the actual detection operation. In the rough detection, the sensing part 300 is moved while focusing on the velocity so as to detect the position roughly. In the precise detection, the sensing part 300 is moved while focusing on the precision so as to detect the position precisely. It is also possible to install a detection pin for detecting the wafer loading position in the R-axis direction in the edge of the first plate 12.

Subsequently, in step S24, as illustrated in FIG. 12B, the wafer transfer device 125a is pivoted in the Y-axis direction such that the laser light R emitted from the sensing part 300 is pivoted in the Y-axis direction. Thus, the two left and right ends of the target pin 18 are detected on the basis of whether a reflected light exists or not, and the bisecting position (that is to say, the center of the teaching jig 10) is detected as the wafer center position in the Y-axis direction. In connection with this detection operation, the approximate position is provisionally detected on the basis of the size of the two left and right ends of the target pin 18, and the actual detection operation is performed by repeating the rough detection and the precise detection.

Figure 12C:
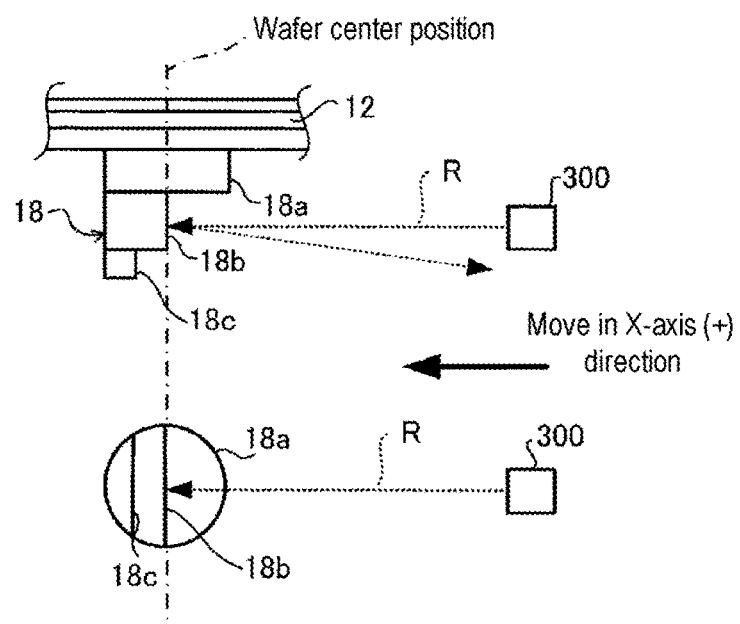
FIG. 12C schematically illustrates an X-axis detection operation using the teaching jig suitably used for an embodiment of the present disclosure.

Subsequently, in step S26, as illustrated in FIG. 12C, the wafer transfer device 125a is moved in the X-axis direction, and the laser light R is emitted from the sensing part 300. Thus, the sensing part 300 detects the position of the target pin 18 (that is to say, the center of the teaching jig 10) in the X-axis direction (that is to say, the distance between the center of the teaching jig 10 and the wafer transfer device 125a) on the basis of the reflected light from the target pin 18. In connection with this detection operation, the approximate position is provisionally detected on the basis of the sizes of the radius of the wafers 200 and the depth of the boat 217, and the actual detection operation is performed by repeating the rough detection and the precise detection. In the present embodiment, since the target pin 18 has a plurality of stepped portions, the detection precision can be improved. Further, the sensed position of the stepped portion 18b is detected as the wafer center position in the X-axis direction.

Figure 12D:
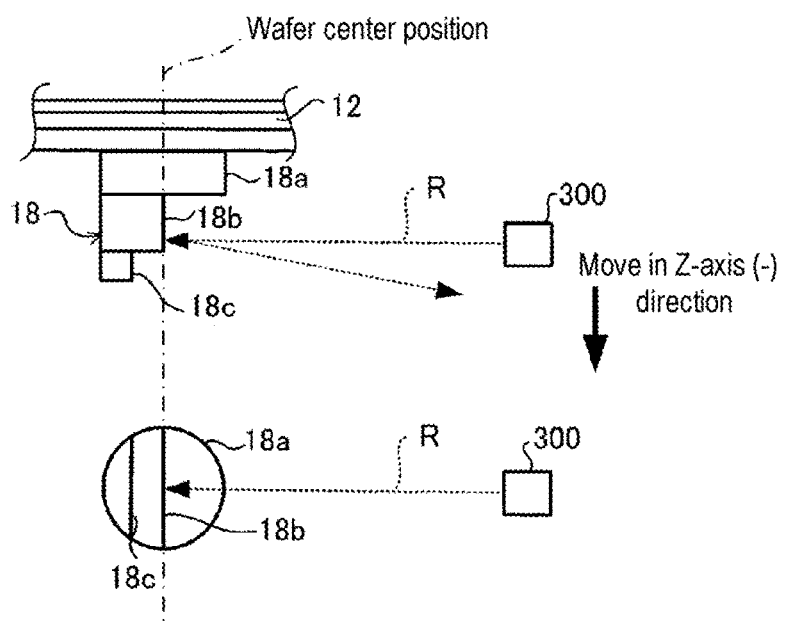
FIG. 12D schematically illustrates a Z-axis detection operation using the teaching jig suitably used for an embodiment of the present disclosure.

Subsequently, in step S28, as illustrated in FIG. 12D, the wafer transfer device 125a is moved in the Z-axis direction, and the laser light R is emitted from the sensing part 300. Thus, the sensing part 300 detects the position of the target pin 18 in the Z-axis direction on the basis of the reflected light from the target pin 18. In connection with this detection operation, the approximate position is assumed (provisionally detected) on the basis of the size of the target pin 18 in the upward/downward direction, and the actual detection operation is performed by repeating the rough detection and the precise detection.

In the aforementioned manner, the R-axis, the X-axis, the Y-axis, and the Z-axis of the teaching jig 10 installed in the uppermost slot and those of the teaching jig 10 installed on the boat groove of the second slot from the bottom (when twenty-five wafers are processed, for example) are detected, thereby detecting the center position of wafers loaded on the boat 217.

As described above, the sensing part 300 has a function of sensing the positions in the R-axis direction, the Y-axis direction, and the Z-axis direction, and sensing the distance in the X-axis direction. In addition, the positional relationship between the sensing part 300 and the center of the tweezers 125*c* is set in advance. Thus, even when the operation control is performed on the basis of the position information obtained by the sensing part 300 installed in a position different from the center of the tweezers 125*c*, the position of the tweezers 125*c* can be accurately controlled in the actual process.

As a result of the teaching operation performed in the above-described manner, the position information that enables the insertion and charging of the teaching jig 10 (that is to say, the wafers 200 in an actual process) into the boat 217 is stored in the memory device 240*c* or the external memory device 244. In the present embodiment, a set of five wafers 200 is transferred by the five tweezers 125*c* of the wafer transfer device 125*a*, and inserted and charged into the boat columns 217*a* with a predetermined clearance. The predetermined clearance as used herein refers to a clearance that prevents the boat columns 217*a* and the wafers 200 from being in contact with each other. The target pin 18 may be installed by setting the position of the target pin 18 such that clearance is provided.

The above teaching process is not only performed when the substrate processing apparatus 100 is initially activated, but is also effective after maintenance is performed after a predetermined number of substrate processing processes. That is to say, even when the dimension of the boat 217 is changed as a result of a change with time, it is still possible to teach the appropriate substrate loading position.

In the above embodiment, the teaching operation for transferring the wafers 200 at the boat 217 side has been described as an example. However, since the teaching jig according to the present disclosure has a boat-loadable shape, the present disclosure can be also applied to a teaching operation related to a wafer transfer to the pod 110, in addition to the teaching operation at the boat 217. In this regard, however, the R-axis detection is not performed in the case of the teaching operation related to the transfer to the pod 110.

(3) Substrate Processing Process

Figure 13:
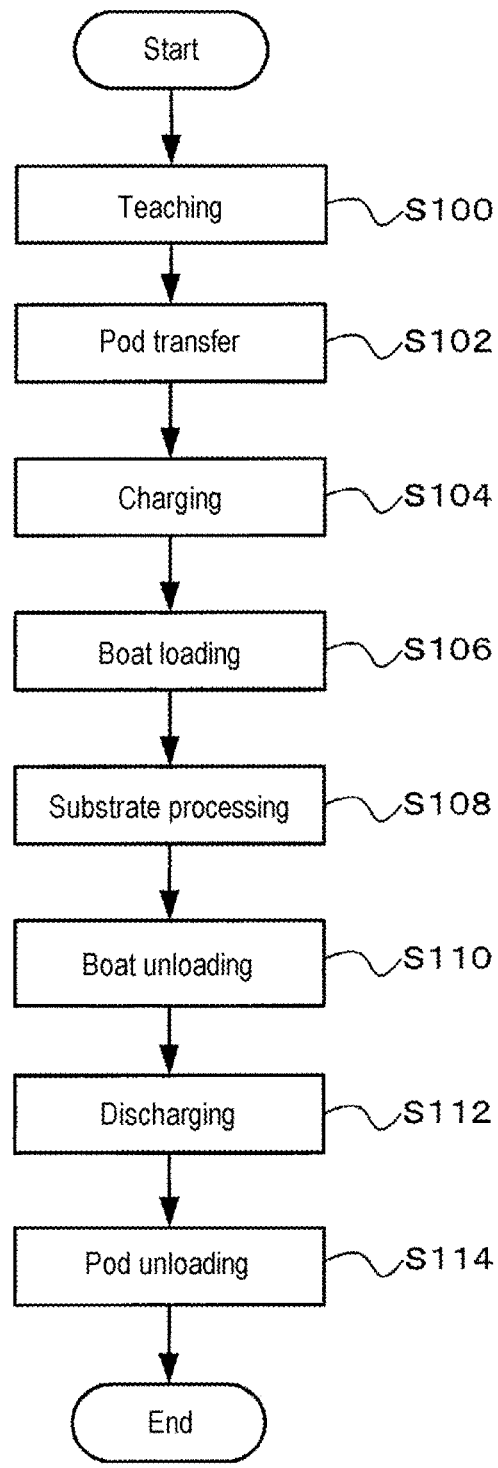
FIG. 13 is a flowchart illustrating a substrate processing suitably used for an embodiment of the present disclosure.

Next, operations of the substrate processing apparatus 100 having the above-mentioned configuration will be described with reference to FIG. 13.

In the following description, it will be assumed that operations of respective parts constituting the substrate processing apparatus 100 are controlled by the controller 240.

After the above-mentioned teaching process (step S100) is completed, as illustrated in FIGS. 1 and 2, the pod 110 is loaded on the load port 114 and the front shutter 113 opens the pod loading/unloading opening 112. Then, the pod 110 loaded on the load port 114 is loaded into the housing 111 from the pod loading/unloading opening 112 by the pod transfer device 118 (step S102). The loaded pod 110 is automatically transferred and delivered to the designated loading portion 117 of the pod shelf 105 by the pod transfer device 118, and is temporarily stored therein. Thereafter, the pod 110 is transferred from the pod shelf 105 to one of the pod openers 121, and is mounted on the mounting stage 122.

Alternatively, the pod 110 may be directly transferred to the pod opener 121 and mounted on the mounting stage 122. At this time, the wafer loading/unloading opening 120 of the pod opener 121 is closed by the cap attaching/detaching mechanism 123, and the clean air 133 is flown to the transfer chamber 124 and fills the same. For example, by filling the transfer chamber 124 with nitrogen gas as the clean air 133, the oxygen concentration in the transfer chamber 124 is set to be equal to or lower than a predetermined value (for example, 20 ppm), which is significantly lower than the oxygen concentration inside the housing 111 (atmospheric atmosphere).

The opening-side section of the pod 110 mounted on the mounting stage 122 is pressed against the peripheral portion of the wafer loading/unloading opening 120 of the front wall 119*a* of the sub housing 119. Thus, the cap that closed the opening of the pod 110 is removed by the cap attaching/detaching mechanism 123 and the pod 110 is opened.

When the pod 110 is opened by the pod opener 121, the wafers 200 are discharged from the pod 110 by the tweezers 125*c* of the wafer transfer device 125*a*, and are charged into the boat 217 that stands-by in the standby part 126 disposed at the rear side in the transfer chamber 124. After delivering a predetermined number of wafers 200 to the boat 217, the wafer transfer device 125*a* returns to the pod 110 and charges next wafers 200 in the boat 217.

At this time, another pod 110 is transferred from the pod shelf 105 and loaded to another pod opener 121 (the lower stage or upper stage pod opener 121) by the pod transfer device 118. Thus, the operation of opening the pods 110 by the pod openers 121 are performed simultaneously.

When a predetermined number of wafers 200 are charged in the boat 217 (step S104), the lower end of the processing furnace 202, which has been closed by the furnace-opening shutter 147, is opened by the furnace-opening shutter 147. Subsequently, the boat 217 holding a group of wafers 200 is loaded into the processing furnace 202 (boat loading), as the seal cap 219 is lifted by the boat elevator 115 (step S106).

After the loading, the wafers 200 are subjected to a specific processing (substrate processing) in the processing furnace 202 (step S108).

After the processing, the boat 217 is unloaded from the processing furnace 202 (boat unloading) in a reverse of the aforementioned order (step S110), the wafers 200 are discharged from the boat 217 to the pod 110 (step S112), and the wafers 200 and the pod 110 are unloaded to the outside of the housing 111 (step S114). Thereafter, another pod 110 that contains unprocessed wafers 200 is transferred, and the process from step S102 to step S114 is performed.

(4) Advantageous Effects of the Present Embodiment

According to the present embodiment, one or more of the following advantageous effects can be obtained:

(a) By forming circular arc portions in the teaching jig, the positioning in the Y-axis direction can be performed easily, and the target pin can be arranged in the substrate loading position with the same precision.

(b) Since the installation position of the teaching jig is detected by the sensing part and the position information of the wafer transfer device is accordingly acquired and stored in the memory device, it is possible to perform the teaching operation of the wafer transfer device with constant precision and without relying on the operator's degree of skill.

(c) By simplifying the installation of the teaching jig, it is possible to significantly reduce the teaching time.

(d) Since the teaching time can be shortened, it is possible to perform an actual process early and to improve the operating efficiency of the semiconductor manufacturing device.

(e) Since the teaching precision is kept constant, the difference between devices decreases, making it possible to perform a substrate processing process with constant precision.

(f) Since the teaching precision can be kept constant, it is possible to set an appropriate substrate loading position even when the substrate holder has been deformed by a change with time.

(g) Since the teaching jig has a boat-loadable shape, the teaching operation can be performed in the same manner with respect to both of the boat and the pod.

In the above embodiment, the example in which the teaching operation is performed with respect to the wafer transfer device 125a of the vertical-type substrate processing apparatus 100 has been described. However, the present disclosure is not limited to the above embodiment, and the teaching operation may also be performed with respect to a wafer transfer device installed in a single wafer-type substrate processing apparatus.

In addition, in the above embodiment, an example in which the wafer transfer device 125a simultaneously transfers five wafers 200 has been described. However, the number of wafers transferred by the wafer transfer device 125a is not specifically limited, and can be set appropriately. Furthermore, various optical sensors can be used as the sensing part 300 according to the present disclosure. For example, it is possible to use a sensor that uses an image for sensing a teaching jig or a wafer and detecting the position thereof. In addition to the optical sensor, it is also possible to use, as the sensing part 300, an ultrasonic sensor, for example, that emits an ultrasonic wave to a target and detects the distance on the basis of the time taken until the reflected wave returns. The type of the sensor is not specifically limited as long as the position of the teaching jig or the wafers can be sensed.

The present disclosure is not limited to semiconductor manufacturing devices, and is also applicable to devices for transferring glass substrates such as LCD devices.

According to the present disclosure, a high-quality substrate processing can be performed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A teaching jig comprising:
a first plate configured to, when the teaching jig is loaded in a substrate holder, be pressed against the substrate holder and indicate a substrate loading position in a forward/backward direction with respect to the substrate holder;
a second plate configured to, when the teaching jig is loaded in the substrate holder, be pressed against the substrate holder and indicate the substrate loading position in a leftward/rightward direction with respect to the substrate holder, the second plate being installed to be perpendicular to the first plate and further configured to move in the forward/backward direction with respect to the first plate; and
a target pin installed in the first plate and configured not to interfere with the movement of the second plate.

2. The teaching jig of claim 1, wherein the second plate has a circular arc portion configured to make contact with a holding member of the substrate holder, and the circular arc portion determines the substrate loading position in the leftward/rightward direction by being brought into contact with the holding member of the substrate holder.

3. The teaching jig of claim 2, wherein a plurality of holding members is installed in the substrate holder, and the circular arc portion is configured as a part of a virtual circle having a diameter larger than a maximum distance between the holding members.

4. The teaching jig of claim 3, wherein the second plate has a plurality of slits formed substantially in parallel with the first plate.

5. The teaching jig of claim 1, further comprising:
a third plate configured to, when the teaching jig is loaded in the substrate holder, be pressed against the substrate holder and indicate the substrate loading position in a rotational direction with respect to the substrate holder, the third plate being further configured to move substantially in parallel with the second plate.

6. The teaching jig of claim 5, wherein the third plate has a longitudinal length longer than a longitudinal length of the second plate.

7. The teaching jig of claim 1, wherein the target pin has a plurality of stepped portions in an upward/downward direction, and at least one of the plurality of stepped portions has a planar front surface configured to receive a sensing signal from a sensor that senses the substrate loading position.

8. The teaching jig of claim 7, wherein the target pin is installed in the same position as a center position of the substrate in the forward/backward direction.

9. The teaching jig of claim 1, wherein an anti-reflection member is installed in the first plate at a rear side of the target pin.

10. A substrate processing apparatus comprising:
a sensor configured to sense positions of a teaching jig in a forward/backward direction, a leftward/rightward direction, and an upward/downward direction, respectively, the teaching jig including:
a first plate configured to, when the teaching jig is loaded in a substrate holder, be pressed against the substrate holder and indicate a substrate loading position in the forward/backward direction with respect to the substrate holder;
a second plate configured to, when the teaching jig is loaded in the substrate holder, be pressed against the substrate holder and indicate the substrate loading position in the leftward/rightward direction with respect to the substrate holder, the second plate being installed to be perpendicular to the first plate and further configured to move in the forward/backward direction with respect to the first plate; and
a target pin installed in the first plate and configured not to interfere with the movement of the second plate;
a memory part that stores position information sensed by the sensor; and
a control part that teaches a substrate transfer device on the basis of the position information stored in the memory part.

11. A teaching method comprising:
sensing positions of a teaching jig in a forward/backward direction, a leftward/rightward direction, and an upward/downward direction, respectively, the teaching jig including:
  a first plate configured to, when the teaching jig is loaded in a substrate holder, be pressed against the substrate holder and indicate a substrate loading position in the forward/backward direction with respect to the substrate holder;
  a second plate configured to, when the teaching jig is loaded in the substrate holder, be pressed against the substrate holder and indicate the substrate loading position in the leftward/rightward direction with respect to the substrate holder, the second plate being installed to be perpendicular to the first plate and further configured to move in the forward/backward direction with respect to the first plate; and
  a target pin installed in the first plate and configured not to interfere with the movement of the second plate;
storing sensed position information; and
teaching a substrate transfer device on the basis of the stored position information.

* * * * *